(12) United States Patent
Hayashi et al.

(10) Patent No.: US 8,178,794 B2
(45) Date of Patent: May 15, 2012

(54) SEALING STRUCTURE

(75) Inventors: Takahiro Hayashi, Fujisawa (JP); Makoto Hora, Fujisawa (JP); Keiichi Miyajima, Fujisawa (JP)

(73) Assignee: NOK Corporation (JP)

( * ) Notice: Subject to any disclaimer, the term of this patent is extended or adjusted under 35 U.S.C. 154(b) by 263 days.

(21) Appl. No.: 12/602,925

(22) PCT Filed: Mar. 7, 2008

(86) PCT No.: PCT/JP2008/054700
§ 371 (c)(1),
(2), (4) Date: Dec. 3, 2009

(87) PCT Pub. No.: WO2009/041087
PCT Pub. Date: Apr. 2, 2009

(65) Prior Publication Data
US 2010/0212953 A1  Aug. 26, 2010

(30) Foreign Application Priority Data
Sep. 26, 2007 (JP) ................................. 2007-248843

(51) Int. Cl.
*H01L 23/02* (2006.01)
*H05K 5/06* (2006.01)

(52) U.S. Cl. .......................................... 174/564; 174/60

(58) Field of Classification Search .................. 174/564, 174/559, 50.64, 60; 455/575.1
See application file for complete search history.

(56) References Cited

U.S. PATENT DOCUMENTS

| 5,247,424 | A  | * | 9/1993  | Harris et al. ................... 361/704 |
| 5,406,027 | A  | * | 4/1995  | Matsumoto et al. .......... 174/546 |
| 5,432,676 | A  | * | 7/1995  | Satoh et al. .................... 361/752 |
| 5,491,300 | A  | * | 2/1996  | Huppenthal et al. .......... 174/151 |
| 6,484,016 | B1 | * | 11/2002 | Cheon .......................... 455/90.1 |
| 6,521,989 | B2 | * | 2/2003  | Zhou .............................. 257/698 |
| 7,251,512 | B2 | * | 7/2007  | Komiyama ................ 455/575.3 |
| 2002/0005574 | A1 | * | 1/2002 | Zhou ............................. 257/680 |
| 2002/0098736 | A1 | * | 7/2002 | Hattori et al. ................. 439/587 |
| 2004/0157481 | A1 | * | 8/2004 | Watanabe ..................... 439/165 |
| 2006/0032653 | A1 | * | 2/2006 | Minoshima et al. ......... 174/52.3 |
| 2010/0176533 | A1 | * | 7/2010 | Hayashi et al. ............... 264/252 |

FOREIGN PATENT DOCUMENTS

| JP | 61-117272    | 7/1986 |
| JP | S61-117272 U | 7/1986 |
| JP | 07-142819 A  | 6/1995 |
| JP | 2000-003978 A | 1/2000 |
| JP | 2003-142836 A | 5/2003 |

(Continued)

*Primary Examiner* — Hung Ngo
(74) *Attorney, Agent, or Firm* — Harness, Dickey & Pierce, P.L.C.

(57) ABSTRACT

To eliminate rubber burr formation at the time of molding and to make sealing members to be surely integrated with the flexible wiring board, a sealing structure consists of housings to which the flexible wiring board is inserted, and sealing members integrally formed on the flexible wiring board to seal gaps between the housings and the flexible wiring board, the flexible wiring board consists of a base board made of an elastic material, a conductive printed wiring layer formed on the surface of the base board, and a cover film covering the surface of the printed wiring layer, and dummy printed wiring layers are arranged in regions where the sealing members are integrated with the flexible wiring board, so as to make a shape as if the printed wiring layer exists substantially over the entire base board in the width direction.

18 Claims, 7 Drawing Sheets

FOREIGN PATENT DOCUMENTS

| | | |
|---|---|---|
| JP | 2004-214927 A | 7/2004 |
| JP | 2005-348341 A | 12/2005 |
| JP | 2006-173224 A | 6/2006 |
| JP | 2006-344813 A | 12/2006 |

* cited by examiner

SEALING STRUCTURE

CROSS-REFERENCE TO RELATED APPLICATIONS

This is a national stage of the International Application No. PCT/JP2008/054700 filed on Mar. 7, 2008 and published in Japanese language.

BACKGROUND OF THE INVENTION

1. Field of the Invention

The present invention relates to a sealing structure.

In more detail, the present invention relates to a sealing structure providing a waterproof mechanism of an electronic equipment and a connector.

2. Description of the Conventional Art

In recent days, a high waterproof function is demanded, while a downsizing is advanced, for a waterproof connector which is used in an electronic equipment such as a cellular phone, an automotive wiring harness and the like.

In order to provide the waterproof function to the electronic equipment constructed by a plurality of spaces, it is necessary to make housings constructing the respective spaces to be airtight, and electrically connect the spaces by a flexible board or the like.

In this case, there have been proposed a method by providing terminals on wall surfaces of the housings which form the respective spaces, and connecting the terminals with wiring members, and a method by putting the wiring member through the wall surfaces of the housings and caulking gaps made between the wiring member and the housings with an adhesive agent or the like.

However, the mode that the terminals are provided on the wall surfaces of the housings has a problem that the equipment is enlarged in size. The method by caulking the gap made between the wiring member and the housings with the adhesive agent or the like causes a problem that a dissembling work and a reassembling work are hard.

Figure 7:
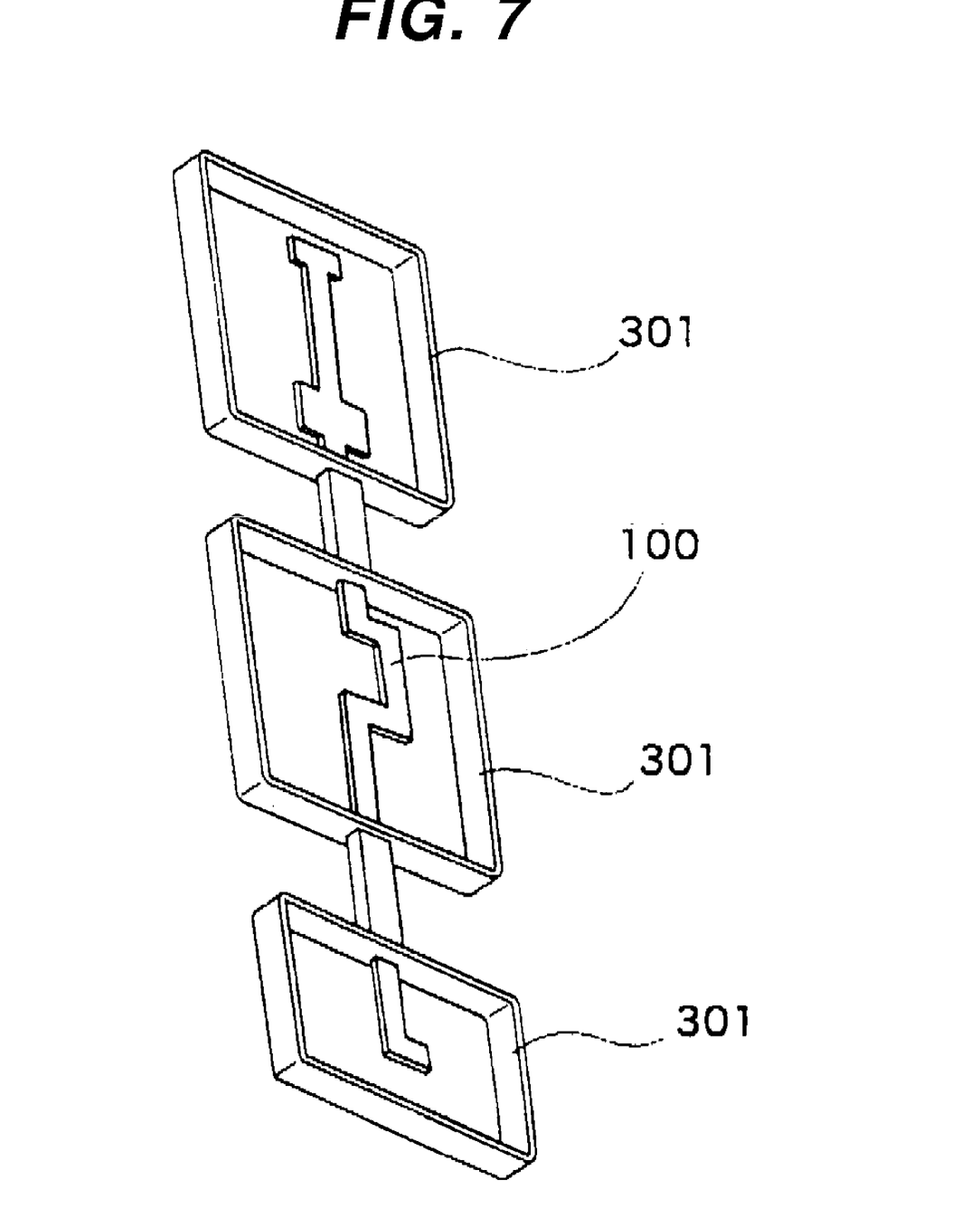
FIG. 7 is a plan view showing a sealing structure in accordance with the conventional art.
Figure 8:
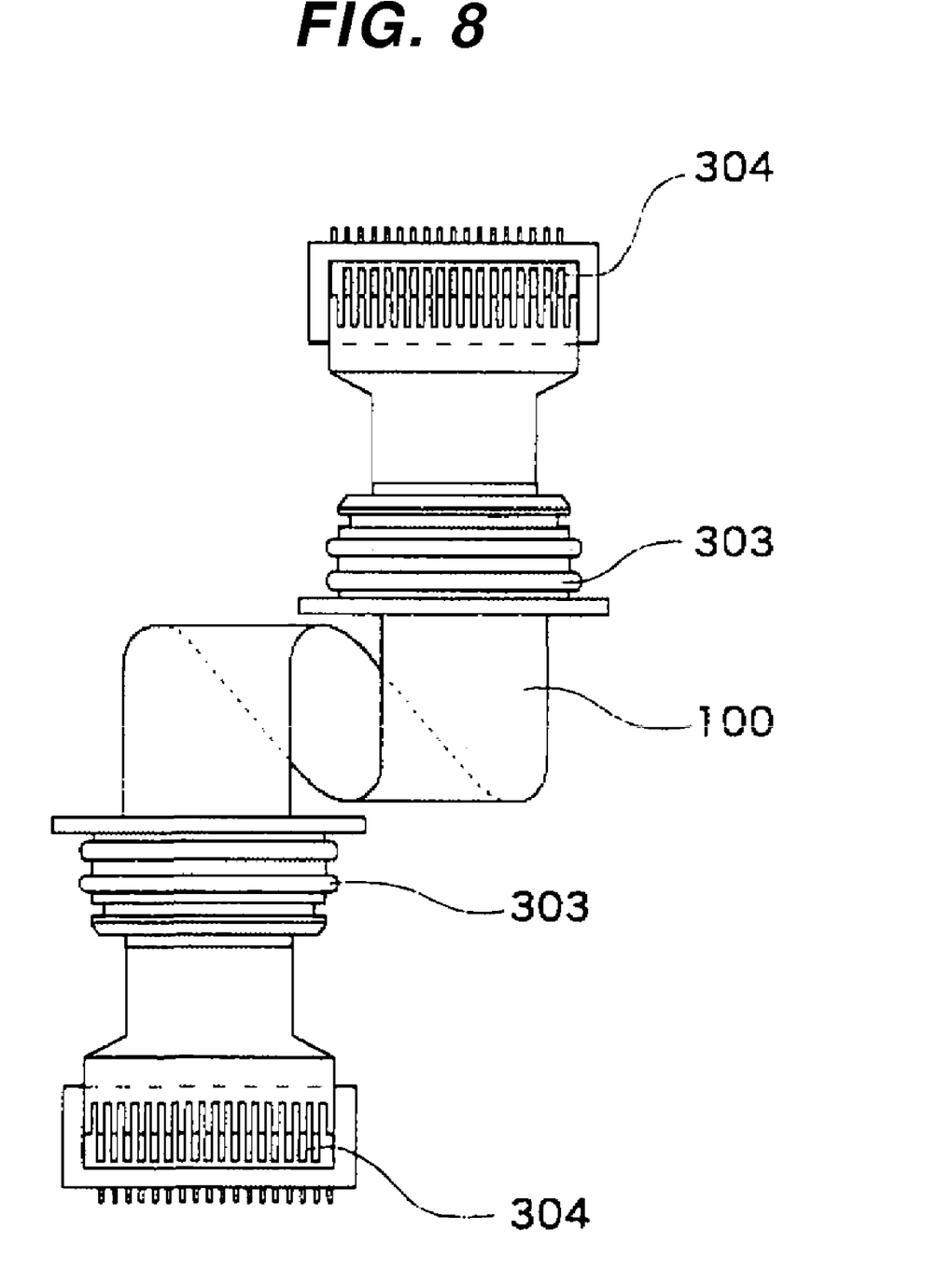
FIG. 8 is a plan view of a sealing structure in accordance with the another conventional art.

Accordingly, as shown in FIGS. 7 and 8, there has been proposed a mode that sealing members are integrally formed on the flexible wiring board (Japanese Unexamined Patent Publication Nos. 2003-142836 and 2004-214927).

In the mode shown in FIG. 7, frame body shaped sealing members 301 corresponding to shapes of respective housings (not shown) are integrally formed with a flexible wiring board 100.

The flexible wiring board 100 extends through each of the sealing members 301, and electronic parts are mounted within regions surrounded by the respective sealing members 301.

Further, in a mode shown in FIG. 8, bush shaped sealing members 303 are integrally formed with the flexible wiring board 100.

The sealing member 303 is installed to an insertion hole provided in each of the housings (not shown).

Further, connectors 304 provided at both ends of the flexible wiring board 100 are electrically connected to electric parts within the housings.

Figure 1:
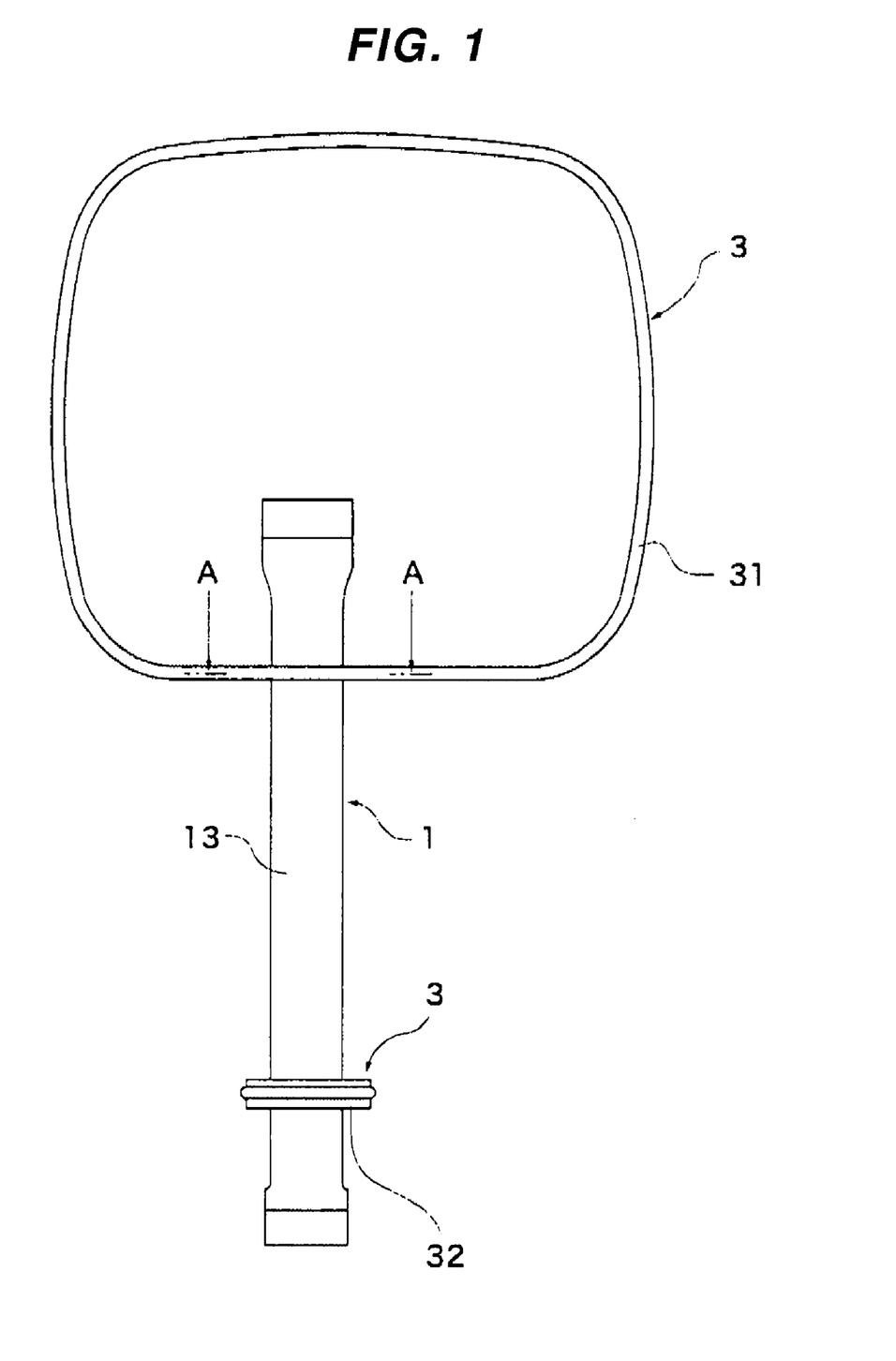
FIG. 1 is a plan view showing an embodiment of a sealing structure to which the present invention is applied.

Further, as shown in FIG. 1, there has been proposed a mode in combination of FIGS. 7 and 8.

In this mode, the frame body shaped seal 31 is integrally formed on one side of the flexible wiring board 1, and the bush shaped seal 32 is integrally formed on the other side, respectively.

Figure 6:
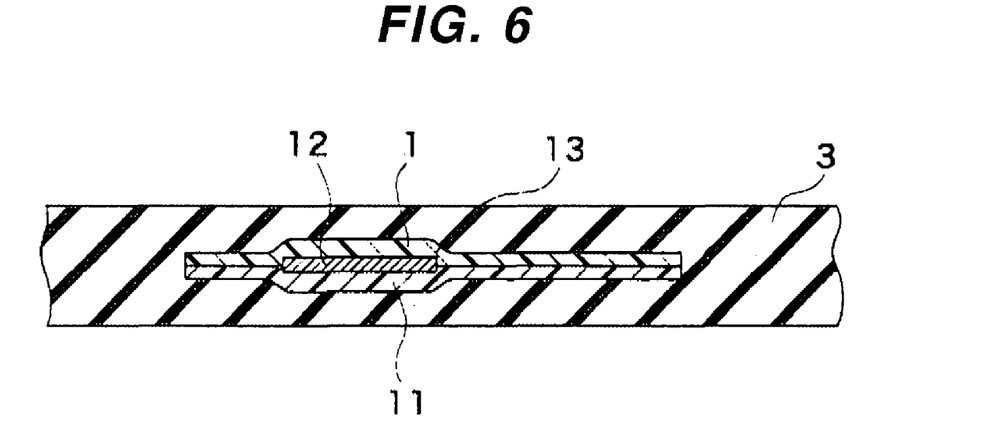
FIG. 6 is a cross sectional view along a line A-A in FIG. 1 in accordance with a conventional art.

However, the following problem is caused as illustrated in FIG. 6 showing a cross section along a line A-A in FIG. 1.

Generally, the flexible wiring board 1 is provided with the following structure.

A printed wiring layer 12 (a circuit pattern) made of a copper foil is adhered fixedly to one face of a base board 11 made of an elastic material such as a polyimide, a polyamide, a polyester, a liquid crystal polymer or the like.

Next, a cover film 13 made of the same material as the elastic material used in the base board 11 is formed on a front face of the printed wiring layer 12, for protecting the front face.

As a result, the printed wiring layer 12 is structured such as to be sandwiched by the base board 11 and the cover film 13.

Further, the printed wiring layer 12 is generally narrower than a width of the base board 11.

In FIG. 6, the width of the printed wiring layer 12 is one third of the base board 11 or less.

As a result, when a molding pressure is applied at a time of integrally forming the sealing members 3 on the flexible wiring board 1, portions where the printed wiring layer 12 does not exist deform thinly in comparison with a portion where the printed wiring layer 12 exists.

Figure 9:
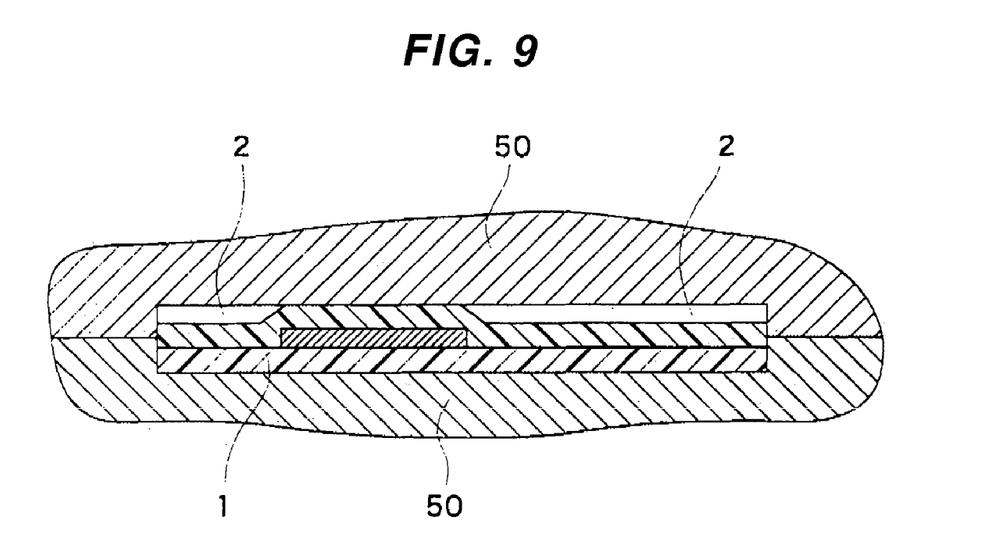
FIG. 9 is a cross sectional view showing a relation between a forming metal mold and a flexible wiring board in accordance with the conventional art.

Accordingly, as shown in FIG. 9, gaps 2 and 2 are unavoidably made between a forming metal mold 50 and the flexible wiring board 1, thereby causing a leakage of a rubber material filled at a time of forming, or giving rise to a problem that a burr is made.

As a result, there is caused a problem that the flexible wiring board 1 and the sealing member 3 are not well bonded.

In this case, FIG. 9 shows a cross section in a direction orthogonal to the flexible wiring board 1 of a portion deviating from a region where the sealing member 3 is formed, in a close state of the forming metal mold 50 used at a time of integrally forming the sealing member 3 on the flexible wiring board 1.

SUMMARY OF THE INVENTION

Problem to be Solved by the Invention

The present invention is made by taking the points mentioned above into consideration, and an object of the present invention is to provide a sealing structure which has a good sealing performance and can be inexpensively manufactured, by making it possible to securely integrate a flexible wiring board 1 and sealing members 3 without producing any rubber burr at a time of integrally forming the sealing members on the flexible wiring board.

Means for Solving the Problem

In order to achieve the object mentioned above, in accordance with the present invention, there is provided a sealing structure comprising:

housings to which a flexible wiring board is inserted; and sealing members integrally formed on the flexible wiring board for sealing gaps between the housings and the flexible wiring board, wherein the flexible wiring board is constructed by a base board made of an elastic material, a conductive printed wiring layer formed on a front face of the base board, and a cover film covering a front face of the printed wiring layer, and dummy printed wiring layers are provided in regions where the sealing members are integrated with the flexible wiring board, to make a shape as if the printed wiring layer exists substantially over the whole of the base board in a width direction.

Effect of the Invention

The present invention achieves effects as described below.

In accordance with the sealing structure of a first aspect of the present invention, no rubber burr is produced at a time of molding, as well as it is possible to securely integrate the sealing members and the flexible wiring board as a whole.

Further, in accordance with the sealing structure of a second aspect of the present invention, it is possible to less affect the printed wiring layer.

Further, in accordance with the sealing structure of a third aspect of the present invention, it is possible to make the gap between the forming metal mold and the flexible wiring board smaller.

Further, in accordance with the sealing structure of a fourth aspect of the present invention, it is possible to inhibit the rubber burr from being made on the whole surface of the metal mold.

Further, in accordance with the sealing structure of a fifth aspect of the present invention, it is possible to apply the sealing structure to various purposes.

Further, in accordance with the sealing structure of a sixth aspect of the present invention, it is possible to enhance a waterproof performance of the whole region including mating faces of the housings.

Further, in accordance with the sealing structure of a seventh aspect of the present invention, it is possible to securely seal between the insertion holes provided in the housings and the flexible wiring board.

Further, in accordance with the sealing structure of an eighth aspect of the present invention, it is possible to apply the sealing structure to various housing shapes.

DETAILED DESCRIPTION OF PREFERRED EMBODIMENT

A description will be given below of the best mode for carrying out the invention on the basis of FIGS. 1 to 5 and 10.

Figure 2:
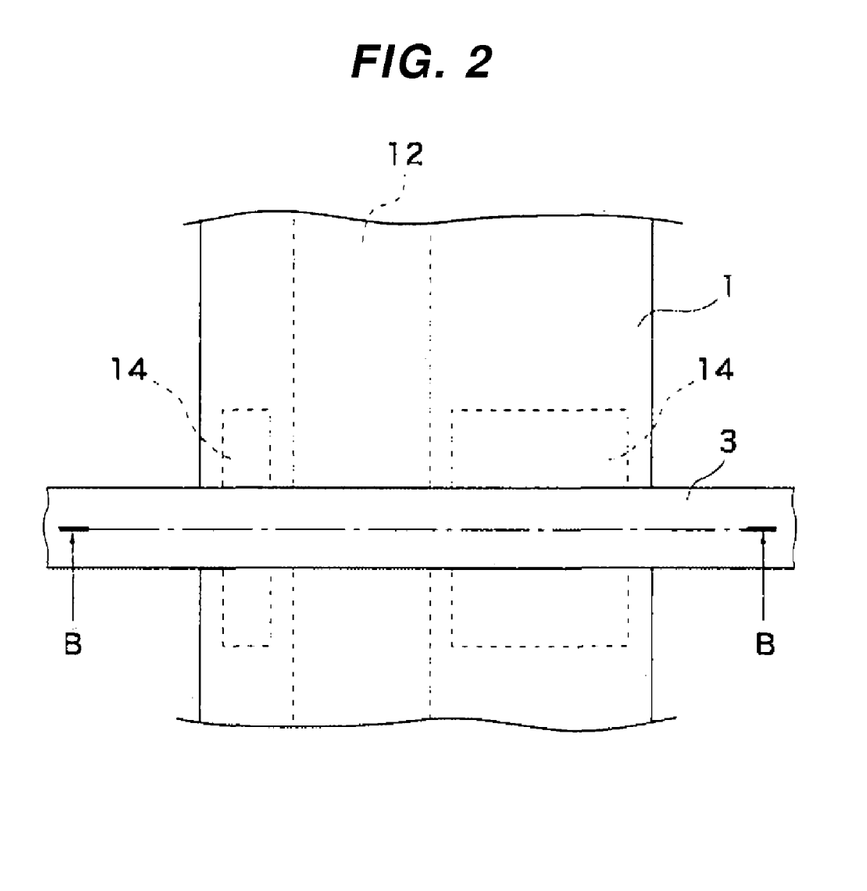
FIG. 2 is a partial plan view of the sealing structure in accordance with the present invention.
Figure 3:
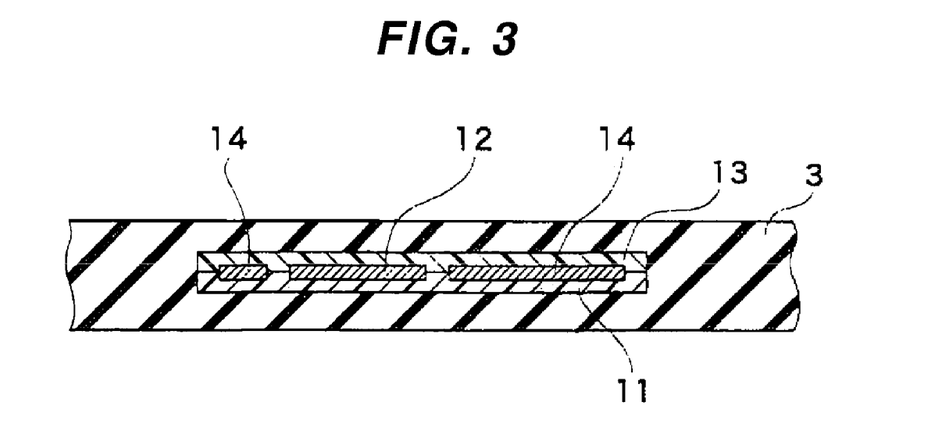
FIG. 3 is a cross sectional view along a line B-B in FIG. 2.

FIG. 1 is a view showing an embodiment of a sealing structure to which the present invention is applied, FIG. 2 shows a first embodiment in accordance with the present invention, and FIG. 3 shows the same position as that in FIG. 6 of the conventional art, and is a cross sectional view along a line B-B in FIG. 2.

In FIG. 1, sealing members 3 and 3 having different shapes are integrally formed at both ends of a flexible wiring board 1.

The sealing member 3 at an upper side of the figure is a frame body shaped seal 31 simultaneously sealing a gap between housings and a gap between the housing and the flexible wiring board 1. The sealing member 3 at a lower side of the figure is a bush shaped seal 32 sealing a gap between an insertion hole provided in the housing and the flexible wiring board 1.

Further, the flexible wiring board 1 is provided with the following structure.

A printed wiring layer 12 (a circuit pattern) made of a copper foil is adhered fixedly to one face of a base board 11 made of an elastic material such as a polyimide, a polyamide, a polyester, a liquid crystal polymer or the like.

Next, a cover film 13 for protecting a front face is formed on a front face of the printed wiring layer 12.

The cover film 13 is formed by the same material as the elastic material used in the base board 11.

As a result, the printed wiring layer 12 is structured such as to be sandwiched by the base board 11 and the cover film 13.

Further, as shown in FIG. 2, at a positions where the sealing member 3 and the flexible wiring board 1 are integrally formed, dummy printed wiring layers 14 and 14 are arranged along the both sides of the printed wiring layer 12, in addition to the normal printed wiring layer 12.

Further, a width of a combination of the printed wiring layer 12 and the dummy printed wiring layers 14 and 14 is close to a width of the flexible wiring board 1.

Further, the dummy printed wiring layers 14 and 14 have such sizes in a length direction that the dummy printed wiring layers 14 and 14 exist in a region where a metal mold and the flexible wiring board 1 contact at a time of molding.

Figure 10:
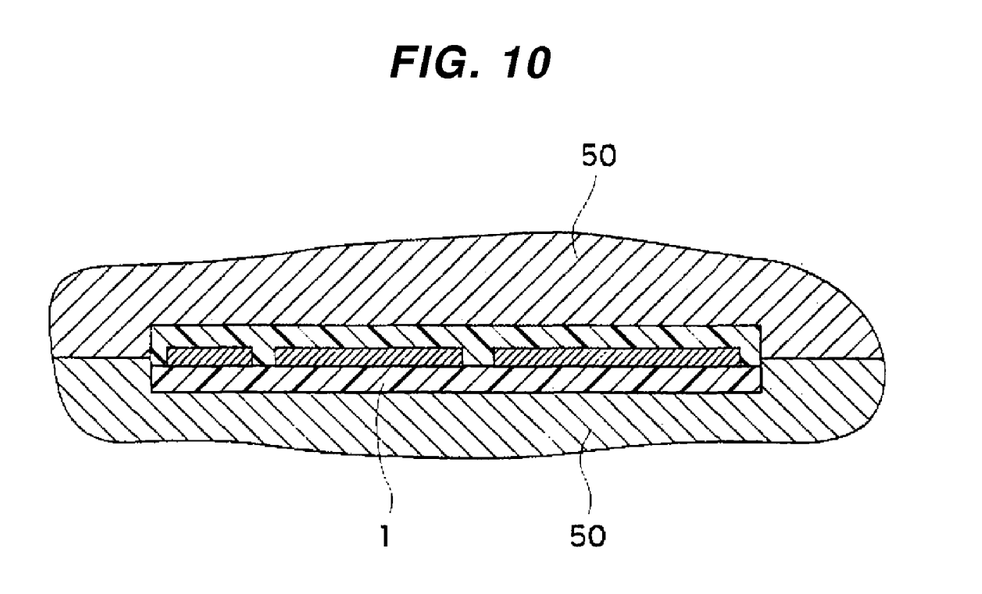
FIG. 10 is a cross sectional view showing a relation between a forming metal mold and a flexible wiring board in accordance with the present invention.

Accordingly, even when the flexible wiring board 1 is arranged within a forming metal mold 50 as shown in FIG. 10, the gap 2 is not made between the metal mold 50 and the flexible wiring board 1 like as the conventional art (FIG. 9).

In this case, FIG. 10 shows the same state as FIG. 9, and shows a cross section in a direction orthogonal to the flexible wiring board 1 of a portion which deviates from the region where the sealing member 3 is formed, in a close state of the forming metal mold 50 used at a time of integrally forming the sealing member 3 on the flexible wiring board 1.

Next, a description will be given of a second embodiment in accordance with the present invention with reference to FIGS. 4 and 5.

Figure 4:
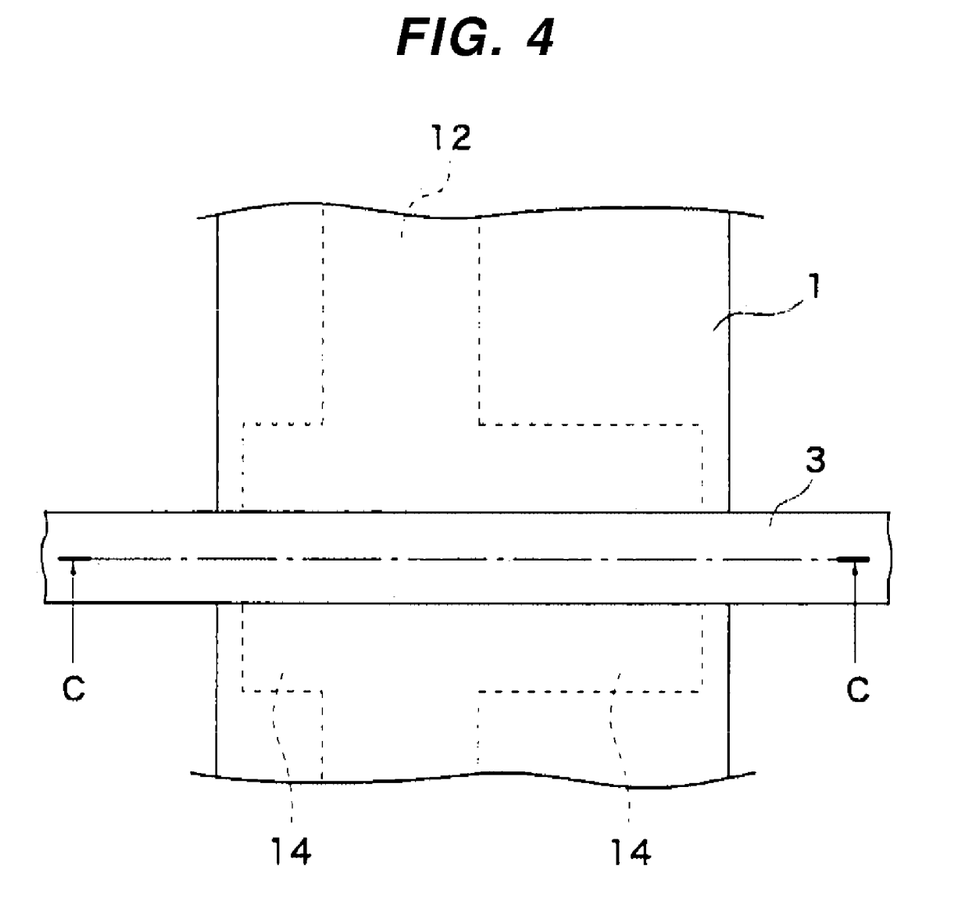
FIG. 4 is a partial plan view of another sealing structure in accordance with the present invention.
Figure 5:
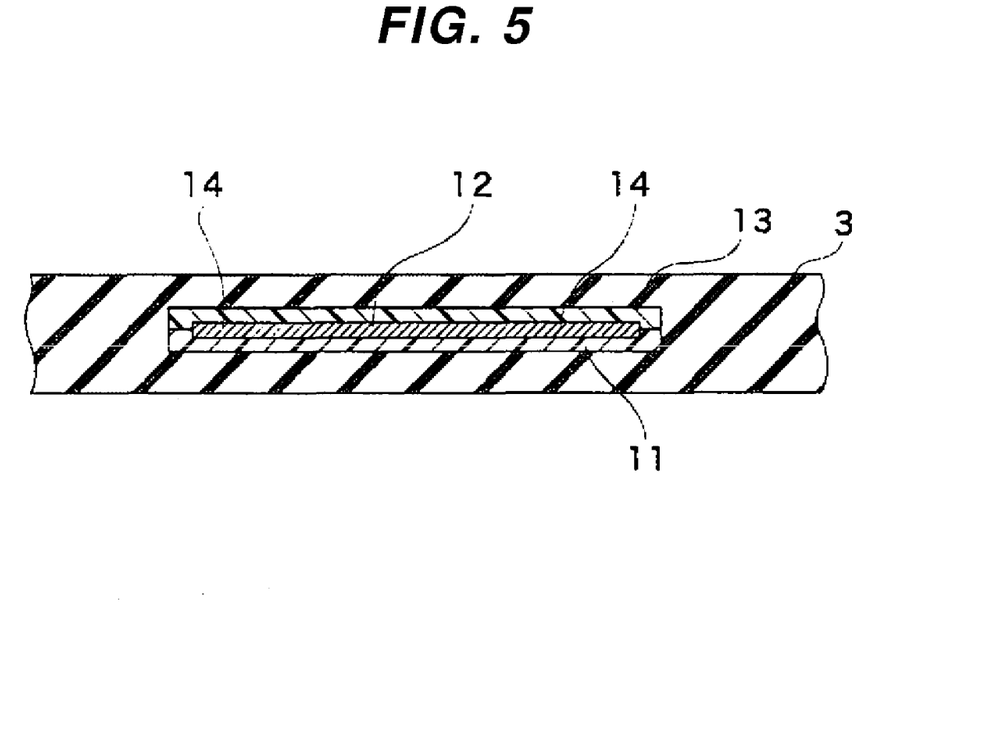
FIG. 5 is a cross sectional view along a line C-C in FIG. 4.

FIG. 5 is a cross sectional view along a line C-C in FIG. 4.

A difference from the first embodiment exists in a point that the dummy printed wiring layers 14 are formed integrally with the printed wiring layer 12.

The other points are the same as the first embodiment.

Further, a rubber-like elastic material such as an acrylic rubber, a fluorine-contained rubber, an EPDM and the like is used in the sealing members 3 and 3, where a self-adhesive liquid rubber is preferable.

Both the frame body shaped seal 31 and the bush shaped seal 32 are integrally formed on the flexible wiring board 1 with using a metal mold.

Both the sealing members 3 and 3 seal a gap between mating faces of the housings, and gaps between the insertion holes provided in the housings and the flexible wiring board 1.

The flexible wiring board 1 may be constructed by a multilayer structure, and the present invention is effective particularly in the multilayer structure flexible wiring board 1.

The housing may be a frame body in a cellular phone or a connector housing.

Further, the sealing member 3 can be in various shapes in addition to those of the frame body shaped seal 31 and the bush shaped seal 32.

Further, the number of the sealing members 3 attached to the flexible wiring board 1 is two in the embodiment, however, may be three or more in correspondence to a structure of an equipment to which the invention is to be applied.

Further, needless to say, the present invention is not limited to the best mode for carrying out the invention mentioned above, but can additionally employ various types of structures without deviating from the scope of the present invention.

Industrial Applicability

The present invention can be utilized in an electronic equipment such as a cellular phone or the like, an automotive wiring harness and the like.

What is claimed is:

1. A sealing structure comprising:
   housings to which a flexible wiring board is inserted; and
   sealing members integrally formed on said flexible wiring board for sealing gaps between said housings and said flexible wiring board,
   wherein said flexible wiring board is constructed by a base board made of an elastic material, a conductive printed wiring layer formed on a front face of said base board, and a cover film covering a front face of said printed wiring layer, and dummy printed wiring layers covered by said cover film are provided in regions where said sealing members are integrated with said flexible wiring board, to make a shape as if said printed wiring layer exists substantially over the whole of said base board in a width direction.

2. A sealing structure as claimed in claim 1, wherein said dummy printed wiring layers are provided independently from said printed wiring layer.

3. A sealing structure as claimed in claim 1, wherein said dummy printed wiring layers are provided integrally with said printed wiring layer.

4. A sealing structure as claimed in claim 1, wherein said dummy printed wiring layers have such sizes in a length direction that the dummy printed wiring layers exist in a region where a metal mold and the flexible wiring board contact at a time of molding.

5. A sealing structure as claimed in claim 2, wherein said dummy printed wiring layers have such sizes in a length direction that the dummy printed wiring layers exist in a region where a metal mold and the flexible wiring board contact at a time of molding.

6. A sealing structure as claimed in claim 3, wherein said dummy printed wiring layers have such sizes in a length direction that the dummy printed wiring layers exist in a region where a metal mold and the flexible wiring board contact at a time of molding.

7. A sealing structure as claimed in claim 1, wherein said flexible wiring board is constructed by a multilayer structure.

8. A sealing structure as claimed in claim 2, wherein said flexible wiring board is constructed by a multilayer structure.

9. A sealing structure as claimed in claim 3, wherein said flexible wiring board is constructed by a multilayer structure.

10. A sealing structure as claimed in claim 1, wherein said sealing members are frame body shaped seals for sealing mating faces of said housings.

11. A sealing structure as claimed in claim 2, wherein said sealing members are frame body shaped seals for sealing mating faces of said housings.

12. A sealing structure as claimed in claim 3, wherein said sealing members are frame body shaped seals for sealing mating faces of said housings.

13. A sealing structure as claimed in claim 1, wherein said sealing members are bush shaped seals installed to insertion holes provided in said housings.

14. A sealing structure as claimed in claim 2, wherein said sealing members are bush shaped seals installed to insertion holes provided in said housings.

15. A sealing structure as claimed in claim 3, wherein said sealing members are bush shaped seals installed to insertion holes provided in said housings.

16. A sealing structure as claimed in claim 1, wherein said sealing members are a combination of said frame body shaped seal and said bush shaped seal.

17. A sealing structure as claimed in claim 2, wherein said sealing members are a combination of said frame body shaped seal and said bush shaped seal.

18. A sealing structure as claimed in claim 3, wherein said sealing members are a combination of said frame body shaped seal and said bush shaped seal.

* * * * *